(12) United States Patent
Tu

(10) Patent No.: US 6,642,097 B2
(45) Date of Patent: Nov. 4, 2003

(54) STRUCTURE FOR CAPACITOR-TOP-PLATE TO BIT-LINE-CONTACT OVERLAY MARGIN

(75) Inventor: Kuo-Chi Tu, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/292,025

(22) Filed: Nov. 12, 2002

(65) Prior Publication Data

US 2003/0077860 A1 Apr. 24, 2003

Related U.S. Application Data

(62) Division of application No. 09/905,817, filed on Jul. 16, 2001, now Pat. No. 6,503,796.

(51) Int. Cl.[7] .......................................... H01L 21/8242
(52) U.S. Cl. ........................ 438/241; 438/253; 438/255
(58) Field of Search ................................. 438/241, 253, 438/255, 239, 254, 396, 397, 398

(56) References Cited

U.S. PATENT DOCUMENTS

| | | | |
|---|---|---|---|
| 5,648,291 A | 7/1997 | Sung | 437/52 |
| 5,700,731 A | 12/1997 | Lin et al. | 438/381 |
| 5,821,140 A | 10/1998 | Jost et al. | 438/241 |
| 5,837,578 A | 11/1998 | Fan et al. | 438/254 |
| 5,893,734 A | 4/1999 | Jeng et al. | 438/239 |
| 6,271,555 B1 * | 8/2001 | Hakey et al. | 257/296 |
| 6,294,426 B1 * | 9/2001 | Tu et al. | 438/255 |
| 6,365,453 B1 * | 4/2002 | Deboer et al. | 438/253 |
| 6,391,736 B1 * | 5/2002 | Uh et al. | 438/396 |
| 6,468,859 B1 * | 10/2002 | Parekh et al. | 438/255 |
| 6,472,266 B1 * | 10/2002 | Yu et al. | 438/241 |

* cited by examiner

*Primary Examiner*—Michael Trinh
(74) *Attorney, Agent, or Firm*—George O. Saile; Stephen B. Ackerman

(57) ABSTRACT

A novel method and structure are described for making capacitor-under-bit line (CUB) DRAM cells with improved overlay margins between bit lines and capacitor top electrodes. After insulating the FETs with a first insulating layer, a second insulating layer is deposited and first openings are etched for capacitor bottom electrodes. A first conducting layer is deposited. The second openings are recessed to the first conducting layer. The first conducting layer is removed and the underlying second insulating layer is recessed. A thin interelectrode layer is deposited. A second conducting layer is deposited to fill the first and second openings, and is polished back to form a novel structure having capacitor top plates that are auto-self-aligned to the second insulating layer over the bit-line contacts. This allows for increased overlay margins and increases cell density.

6 Claims, 14 Drawing Sheets

STRUCTURE FOR CAPACITOR-TOP-PLATE TO BIT-LINE-CONTACT OVERLAY MARGIN

This is a division of patent application Ser. No. 09/905,817, filing date Jul. 16, 2001, U.S. Pat. No. 6,503,796, Method And Structure For A Top Plate Design For Making Capacitor-Top-Plate To Bit-Line-Contact Overlay Margin, assigned to the same assignee as the present invention.

BACKGROUND OF THE INVENTION

1. Field of the Invention

The present invention relates to a process for making capacitor-under-bit-line dynamic random access memory (DRAM) device structures having an improved capacitor top plate design, and more specifically the process employs a novel mask design and a sequence of novel process steps for improving the overlay margin between the bit-line contacts and the capacitors top plates. This method allows the capacitors top plate to be auto-self-aligned to the bit-line contact for increased memory cell density.

2. Description of the Prior Art

Dynamic random access memory (DRAM) circuits are used extensively in the electronics industry for storing date. The DRAM circuit includes an array of memory cells, each cell consisting of a single capacitor and a single transfer transistor. Typically the transfer transistor is a field effect transistor (FET). Binary data (1's and 0's) are stored as charge on the capacitors, and the transfer transistor is used to retain the charge. During the read cycle the transfer transistor is used to interrogate the cell by means of bit lines. Two types of memory cells that are commonly used include a cell having a trench capacitor formed in the substrate under the FETs, and a cell having a stacked capacitor that is built over and between FETs. In the fabrication of DRAM circuits having stacked capacitors, the capacitor can be formed over the bit lines, commonly referred to as Capacitors-Over-Bit-lines (COB), or under the bit lines, commonly referred to as Capacitors-Under-Bit lines (CUB). For all of the DRAM structures described above, the number of memory cells on a DRAM chip has increased dramatically over the years, and after the year 2000 the number of cells is expected to exceed 1 Gigabit. This increase is a result of the downsizing of the discrete devices using improved high-resolution photolithography, improved directional plasma etching, and self-aligning techniques, with a resulting increase in circuit density.

Numerous methods of making these higher density DRAM devices have been reported. For example, Jeng et al. in U.S. Pat. No. 5,893,734 describe a method for fabricating CUB DRAMs using tungsten landing plugs. U.S. Pat. No. 5,837,579 to Fan et al. describes trenched stacked capacitors, but does not address the formation of the bit-line contact. In U.S. Pat. No. 5,700,731 to Lin et al., a method is described for making a crown-shaped capacitor using an edge phase shift mask, but also does not address the bit-line contact/bit-line formation. In U.S. Pat. No. 5,648,291 to Sung a method is describes for making bit-line contacts self-aligned to underlying capacitors using a thin dielectric sidewall in the bit-line contact openings etched through the capacitor. And in U.S. Pat. No. 5,821,140 to Jost et al. a method is described in which the capacitor with annular bit-line contacts are formed concurrently on a substrate.

Although downscaling of devices and self-aligning techniques have dramatically increased the memory cell density on DRAM chips, there is still a strong need in the industry to further improve the structure and process to provide a more reliable, process with further increase in cell density. More specifically, it is highly desirable to improve the overlay margins between the capacitors and the bit-line contacts.

SUMMARY OF THE INVENTION

A principal object of the present invention is to form an array of closely spaced dynamic random access memory (DRAM) cells, with increased overlay margins between capacitor top plates and bit-line contacts resulting in increased memory cell density for Capacitor-Under-Bit line (CUB) DRAM circuits.

Another objective of this invention is to achieve the improved overlay margin by using a novel process and structure resulting in auto-self-aligned capacitor top plates to the bit-line contact to form an improved memory cell structure.

This novel memory cell structure consists of an array of stacked capacitors under bit lines that have an improved overlay margin between the bit-line contacts and the capacitor top electrodes. The method for making the array of memory cells begins by providing a semiconductor substrate having partially completed DRAM devices. The substrate is single-crystal-silicon doped with a P type conductive dopant, such as boron (B). Shallow trench isolation (STI) regions are formed surrounding and electrically isolating an array of device areas for memory cells on the substrate. To form the STI shallow trenches are etched in the substrate, and the trenches are filled with an insulating material, such as silicon oxide ($SiO_x$), and is polished back to the substrate to form a planar surface. These partially completed DRAMs also include word lines that extend over the device areas to form field effect transistors (FETs). Typically the FETs consist of a thin gate oxide on the device areas, and gate electrodes formed from a patterned polycide layer (word lines). The FETs also have source/drain areas, one on each side and adjacent to the FET gate electrodes.

A relatively thin conformal silicon nitride ($Si_3N_4$) barrier layer is formed over the device areas and over the STI regions to insulate the FET devices on the DRAM circuit. A first insulating layer is deposited on the substrate, and conducting first and second plug contacts are formed concurrently in the first insulating layer to contact the source/drain areas of the FETs. The conducting first plug contacts extend through the first insulating layer to the first source/drain areas for capacitors, and the conducting second plug contacts extend through the first insulating layer to the second source/drain areas for bit-line contacts. A second insulating layer is deposited, and first openings are formed in the second insulating layer aligned over the first conducting plug contacts. Capacitor bottom electrodes are formed in the first openings aligned over and contacting the first conducting plug contacts. A conformal first conducting layer, such as a doped polysilicon layer, is deposited over the second insulating layer and in the first openings for forming the capacitor bottom electrodes. Additionally, a hemispherical silicon grain (HSG) layer can be formed on the polysilicon layer to increase the surface area for increased capacitance.

A key feature of this invention is to deposit an organic layer sufficiently thick to fill the first openings and to provide an essentially planar top surface. Preferably the organic layer is a photoresist layer. The photoresist layer is patterned to leave portions aligned over the second plug contacts, and to leave portions extending over the edge of the first openings. The patterning is achieved by partially exposing the photoresist through a photomask that has a novel design, and partially developing the photoresist. This patterning results in the photoresist protecting the underlying second insulating layer over the second plug contact (for the bit line), while further recessing the photoresist to expose the first conducting layer elsewhere over the top surface of the second insulating layer. The exposed portions of the first conducting are removed to expose the underlying portions of the second insulating layer. The remaining photoresist is completely removed including the photoresist in the first openings. The exposed portions of the second insulating layer are then selectively and partially etched back to recess those portions below the top portions of the second insulating layer over the second plug contacts. The first conducting layer protects the second insulating layer over the second plug contacts during the selective etching. A thin conformal interelectrode dielectric layer is formed on the first conducting layer (for bottom electrodes). Next a second conducting layer is deposited sufficiently thick to fill the first openings and to fill the recesses over the second insulating layer. The second and the first conducting layers are polished back to the second insulating layer over the second plug contacts to form the capacitor top plates, which are auto-self-aligned to the second insulating layer over the second plug contacts. The auto-self-align results from the polish-back to the top surface of the second insulating layer. This sequence of process steps and novel structure provides an improved overlay margin between the capacitor and the bit-line contacts that are formed next. A third insulating layer is deposited to electrically insulate the capacitor top electrodes. Second openings for bit-line contacts are etched in the third insulating layer and in the second insulating layer aligned over and etched to the second plug contacts. A third conducting layer is deposited to fill the second openings and is polished or etched back to form bit-line contacts. A fourth conducting layer is deposited and patterned to form bit lines over and contacting the bit-line contacts to complete the array of novel memory cells for the DRAM device.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

The method for making these stacked capacitors with improved overlay margins between the bit lines and the capacitor top plates for DRAM devices is now described in detail. The invention utilizes a novel photomask and sequence of process steps to auto-self-align the capacitor top plate to a portion of an insulating layer in which the bit-line contact openings are etched. This improved overlay margin allows for increased memory cell density.

Although the method is described for making stacked capacitors on memory cells having N-channel FETs, it should also be well understood by one skilled in the art that by including additional process step, in addition to those described in the embodiment, other types of devices can also be included on the DRAM chip. For example, by forming N-well regions in a P doped substrate, P-channel FETs can also be-provided to form Complementary Metal-Oxide-Semiconductor (CMOS) circuits, such as required for peripheral circuits on the DRAM chip.

Figure 1:
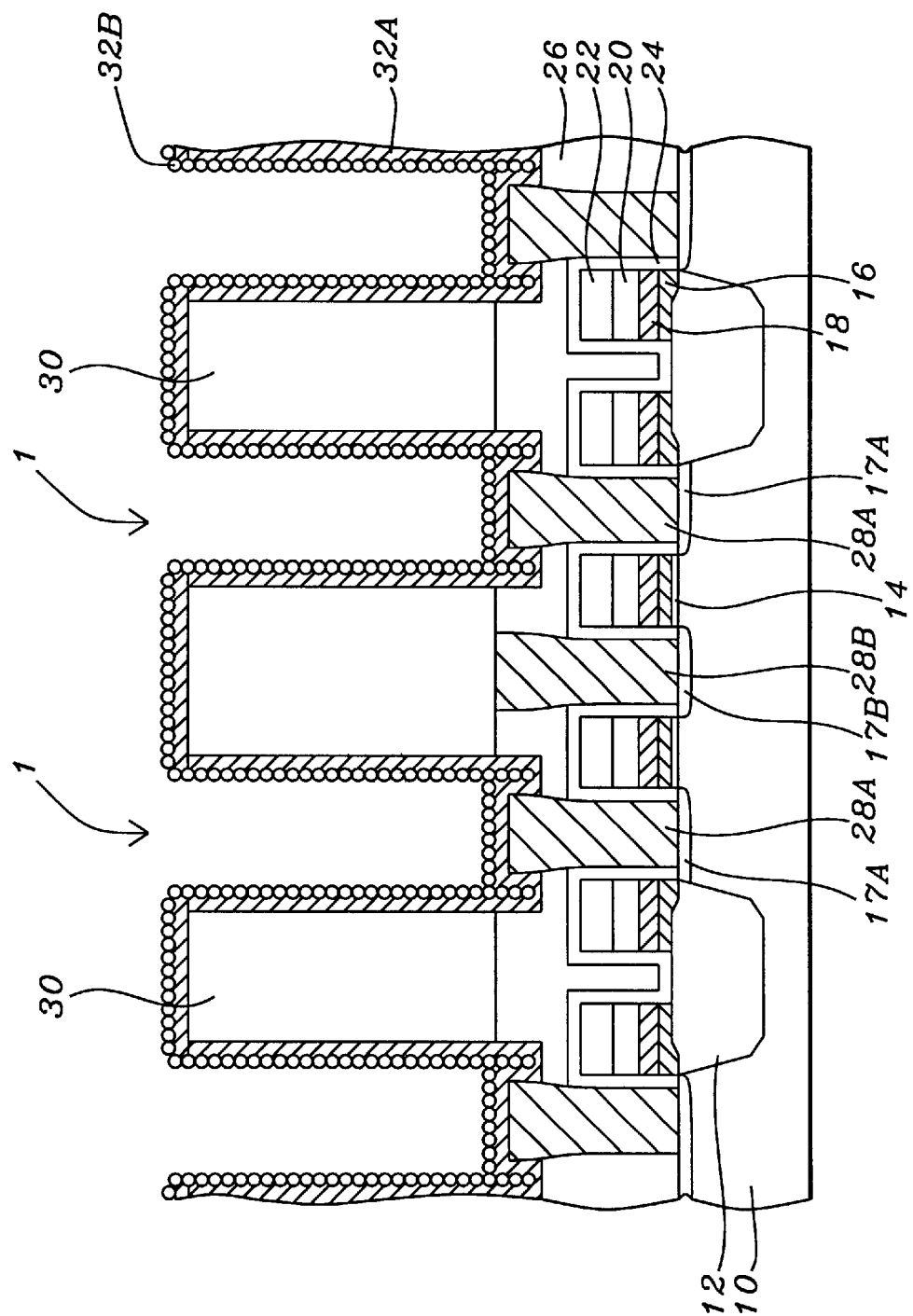
FIGS. 1–14 show schematic views for the sequence of process steps for making a capacitor-under-bit-line (CUB) DRAM cell with improved overlay margin between the bit lines and capacitor top plates.

Referring first to FIG. 1, a schematic cross-sectional view of a portion of a semiconductor substrate 10 is shown having partially completed DRAM cells. These partially completed DRAM cells are described briefly since they are not essential for describing the novel features of this invention. The substrate 10 is typically composed of a lightly doped P type single-crystal silicon having a <100> crystallographic orientation and having an array of memory cell areas surrounded and electrically isolated by shallow trench isolation (STI) regions 12. The cross section through the DRAM cell area shows a series of closely spaced gate electrodes for N-channel FETs. A gate oxide 14 is formed on the device areas for the FETs. Next a stacked layer of doped polysilicon 16, a metal silicide layer 18, a cap oxide layer 20, and a nitride layer 22 are deposited and patterned to form the FET gate electrodes (16, 18) having the cap layer comprised of layers 20 and 22. Source/drain contact areas 17 are formed in the substrate 10 adjacent to the FET gate electrodes (16, 18) by ion implantation of a N type dopant, such as arsenic or phosphorous. A conformal silicon nitride ($Si_3N_4$) layer 24 is deposited to form a liner/barrier layer. Typically the liner 24 is deposited by LPCVD to a thickness of between about 500 and 1500 Angstroms.

Still referring to FIG. 1, a first insulating layer 26 is deposited on the substrate and is planarized over the FETs. The first insulating layer is typically silicon oxide ($SiO_2$) deposited by LPCVD using tetraethosiloxane (TEOS) as the reactant gas. Alternatively dopants such as boron and phosphorus can be added to layer 26 during deposition to form a borophosphosilicate glass (BPSG). The first insulating layer 26 is then planarized, for example, by chemical-mechanical polishing (CMP) to leave a thickness of between about 4000 and 6000 Angstroms over the FET devices.

Next conventional photolithographic techniques and anisotropic plasma etching are used to etch self-aligned contact (SAC) openings in layer 26. The contact openings are etched to the source/drain areas 17A for capacitor nodes, and to the source/drain areas 17B for self-aligned contact openings for the shared bit-line contacts. An electrically conducting material 28 is deposited and polished back to concurrently fill the contact openings to form first conducting plug contacts 28A for capacitors, and to form second plug contacts 28B for the bit lines. Preferably the electrically conducting material 28 is an N doped polysilicon, deposited by LPCVD using a reactant gas containing silane ($SiH_4$) or dichlorosilane ($SiCl_2H_2$), and is deposited to a thickness sufficient to fill the openings. The polysilicon 28 is then polished back to the first insulating layer 26 to form the conducting plugs 28A and 28B.

Continuing with the process, as shown in FIG. 1, a second insulating layer 30 is deposited. Preferably the second insulating layer 30 is $SiO_2$ and is deposited by LPCVD using a reactant gas such as TEOS. The second insulating layer defines the height of the capacitor bottom electrodes and is deposited to a thickness determined by circuit design, and more specifically to a thickness of between about 10000 and 25000 Angstroms. First openings 1 are etched in the second insulating layer 30 aligned over and to the first conducting plug contacts 28A using conventional photolithographic techniques and plasma etching. Next a conformal first conducting layer 32A is deposited over the second insulating layer and in the first openings 1 that will later form the capacitor bottom electrodes 32A in the first openings 1 aligned over and contacting the first conducting plug contacts 28A. The first conducting layer 32A is an in-situ N doped polysilicon, and is deposited to a thickness of between about 300 and 700 Angstroms. Alternatively, layer 32A can be an amorphous silicon layer, which is annealed to form a thin hemispherical silicon grain (HSG) layer 32B on its surface to further increase surface area (capacitance) of the first conducting layer 32A.

Figure 2:
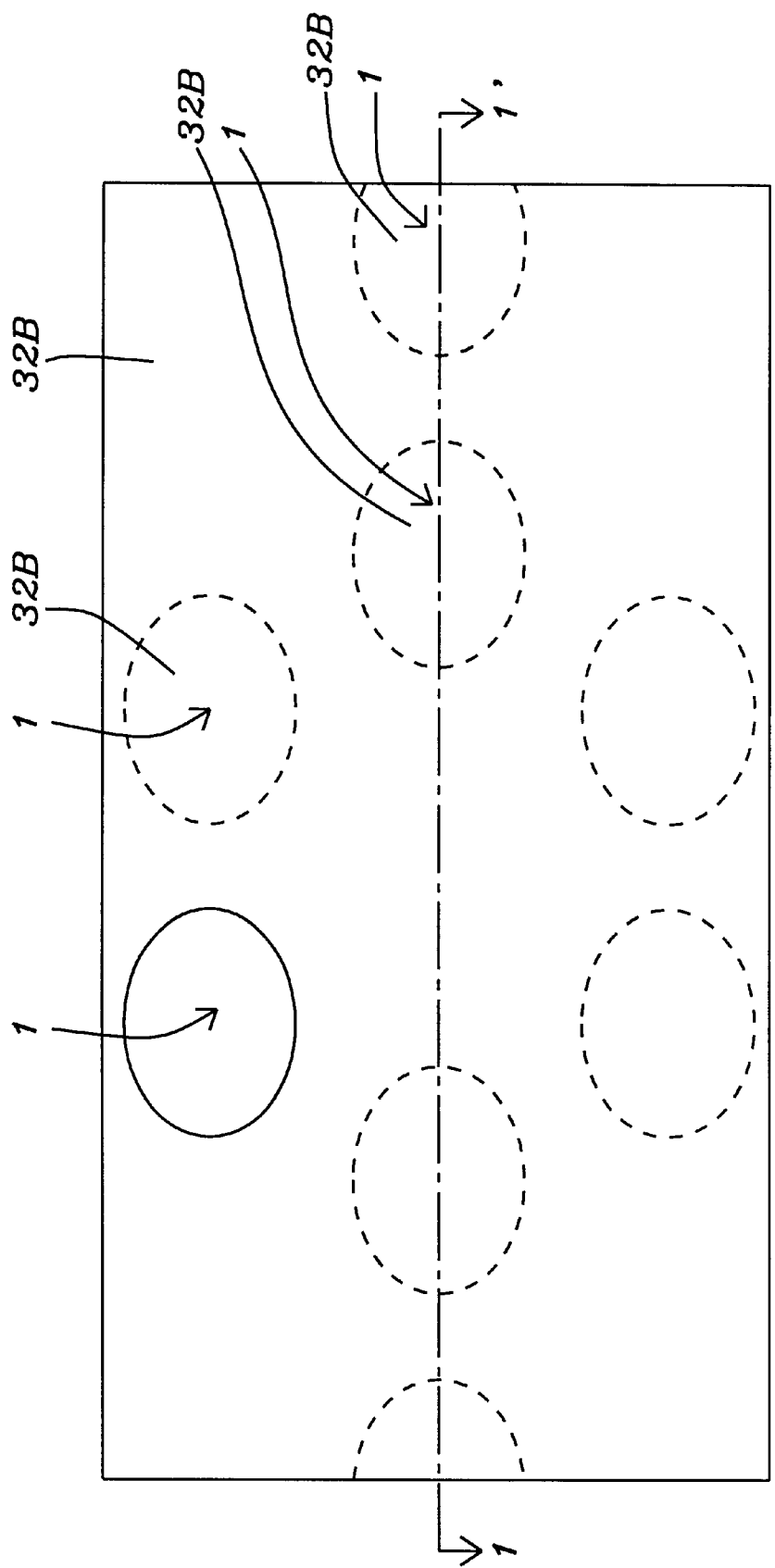

A top view of the structure is shown in FIG. 2. The region 1–1' in FIG. 2 is for the cross section in FIG. 1. The top view of FIG. 2 shows openings 1 for the capacitors with the blanket conformal HSG layer 32B on the surface of the substrate.

Figure 3:
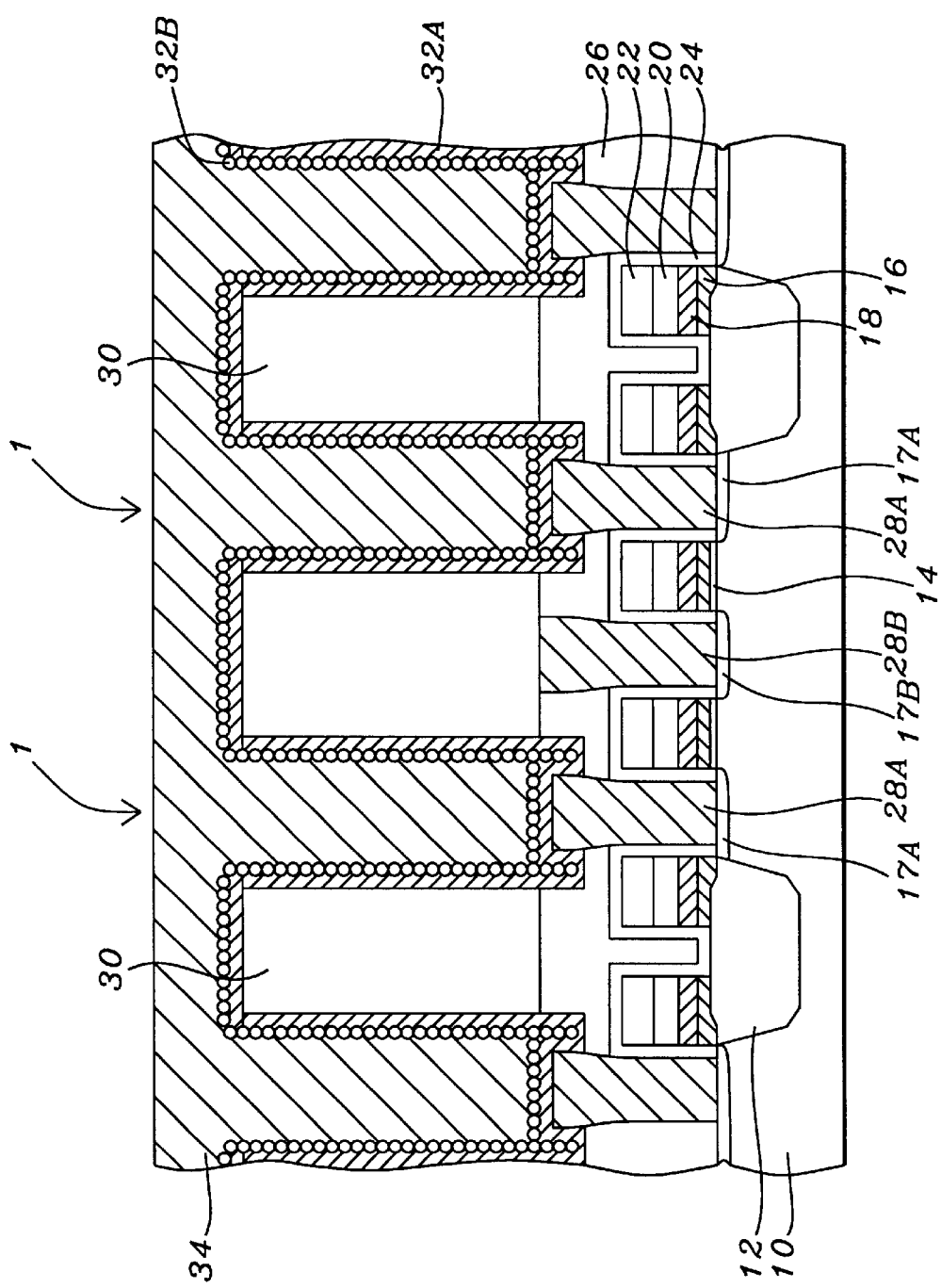

Referring to FIG. 3, a key feature of this invention is to deposit an organic layer 34 sufficiently thick to fill the first openings 1 and to provide an essentially planar top surface. The organic layer is preferably a photoresist layer that is deposited, for example, by spin coating, and can be either a positive or a negative-type photoresist, but is preferably a positive-type photoresist.

Figure 4:
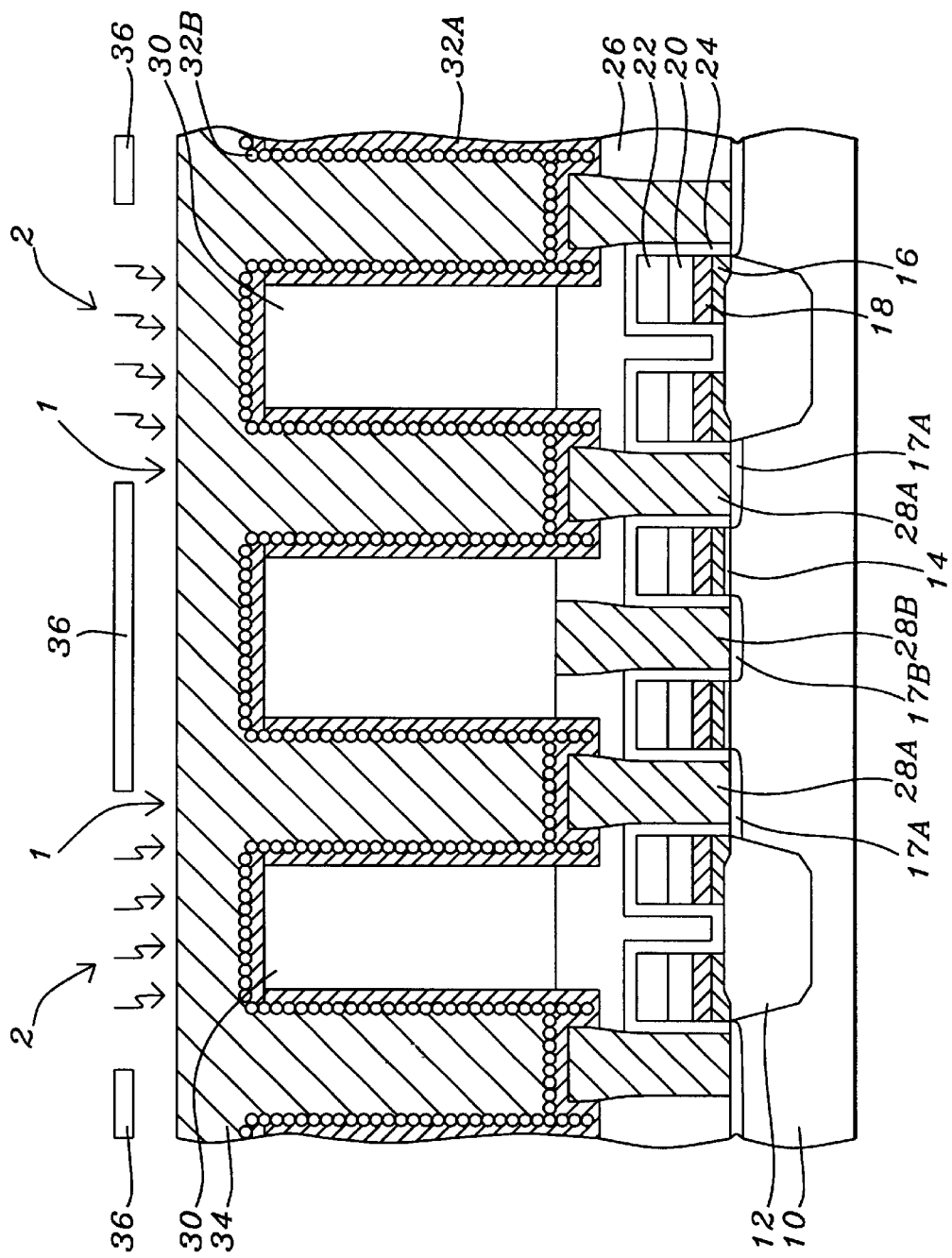

Referring next to FIG. 4, a photomask 36 having a novel design is used to expose the photoresist layer 34 to form second openings 2 between adjacent storage nodes (capacitors formed in openings 1). The second openings 2 are formed by partially exposing the photoresist 34 through the photomask 36.

Figure 5:
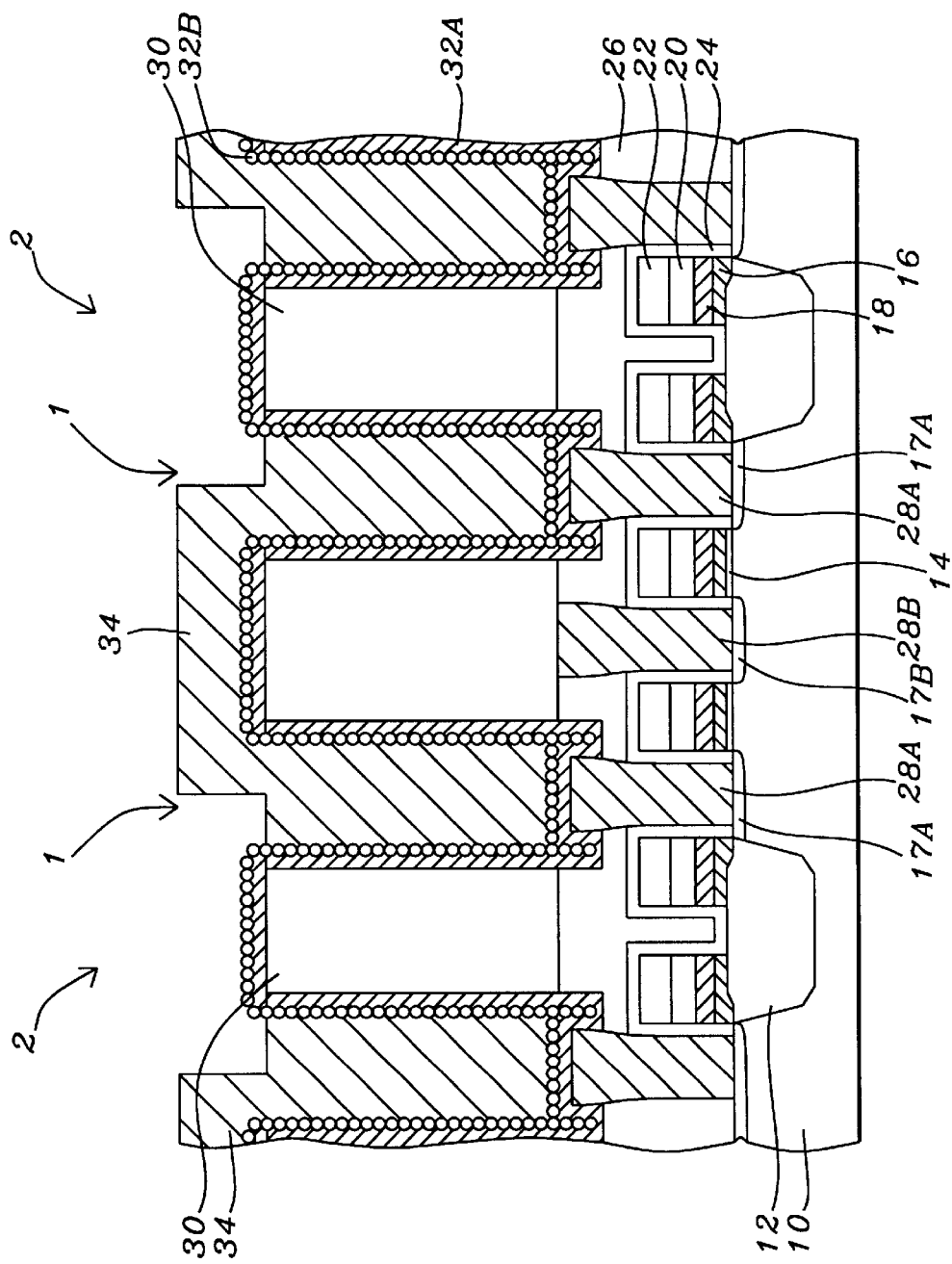

Referring to FIG. 5, after partially exposing the photoresist 34, the photoresist is partially developed to leave portions of the photoresist 34 on the second insulating layer 30 over the second plug contacts 28B. The openings 2 extend over the edge of the first openings 1. The photoresist is developed to expose the HSG layer 32B between the capacitors while the photoresist remains in the openings 1 to protect the HSG layer 32B from etching. The photoresist 34 is also retained over the second plug contacts 28B to protect the HSG layer 32B, which is later used as an etch-stop (hard) mask.

Figure 6:
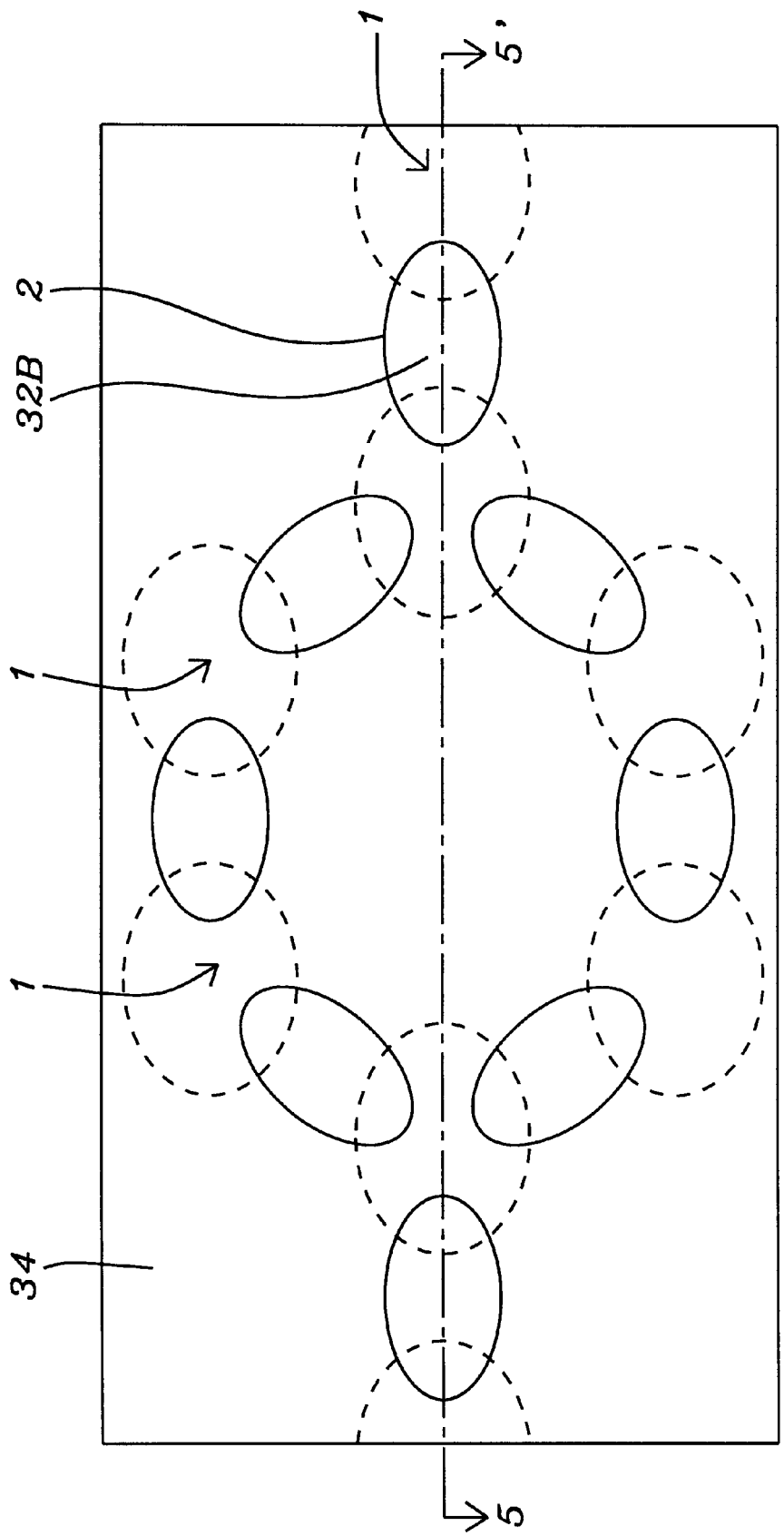

Referring to FIG. 6, a top view of the structure is shown and the region labeled 5–5' is for the cross section in FIG. 5. FIG. 6 shows a top view of the novel photomask 36 (shown in cross section in FIG. 4). The photomask is designed to form openings 2 in the photoresist layer 34 between, and extending over the openings 1 for the capacitor bottom electrodes (storage nodes). When the photoresist 34 is partially developed, as shown in FIG. 5, the top surface of the first conducting layer (32B, 32A) is exposed in the openings 2.

Figure 7:
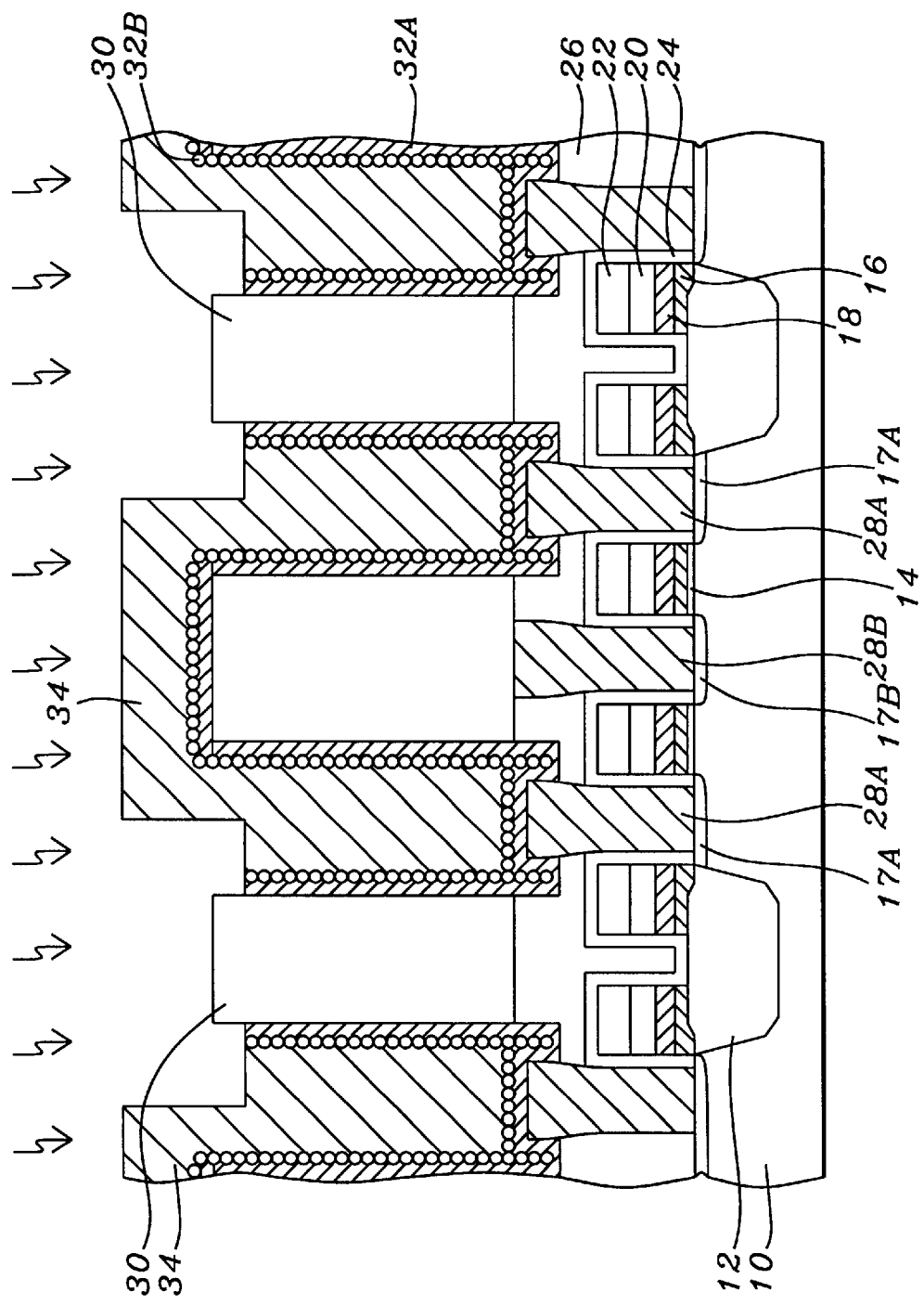

Referring to FIG. 7, the exposed portions of the first conducting layer (32A, 32B) are selectively removed to expose the underlying portions of the second insulating layer 30. The first conducting layer 32A and 32B are preferably removed by plasma etching using a high-density plasma etcher and an etchant gas such as chlorine.

Figure 8:
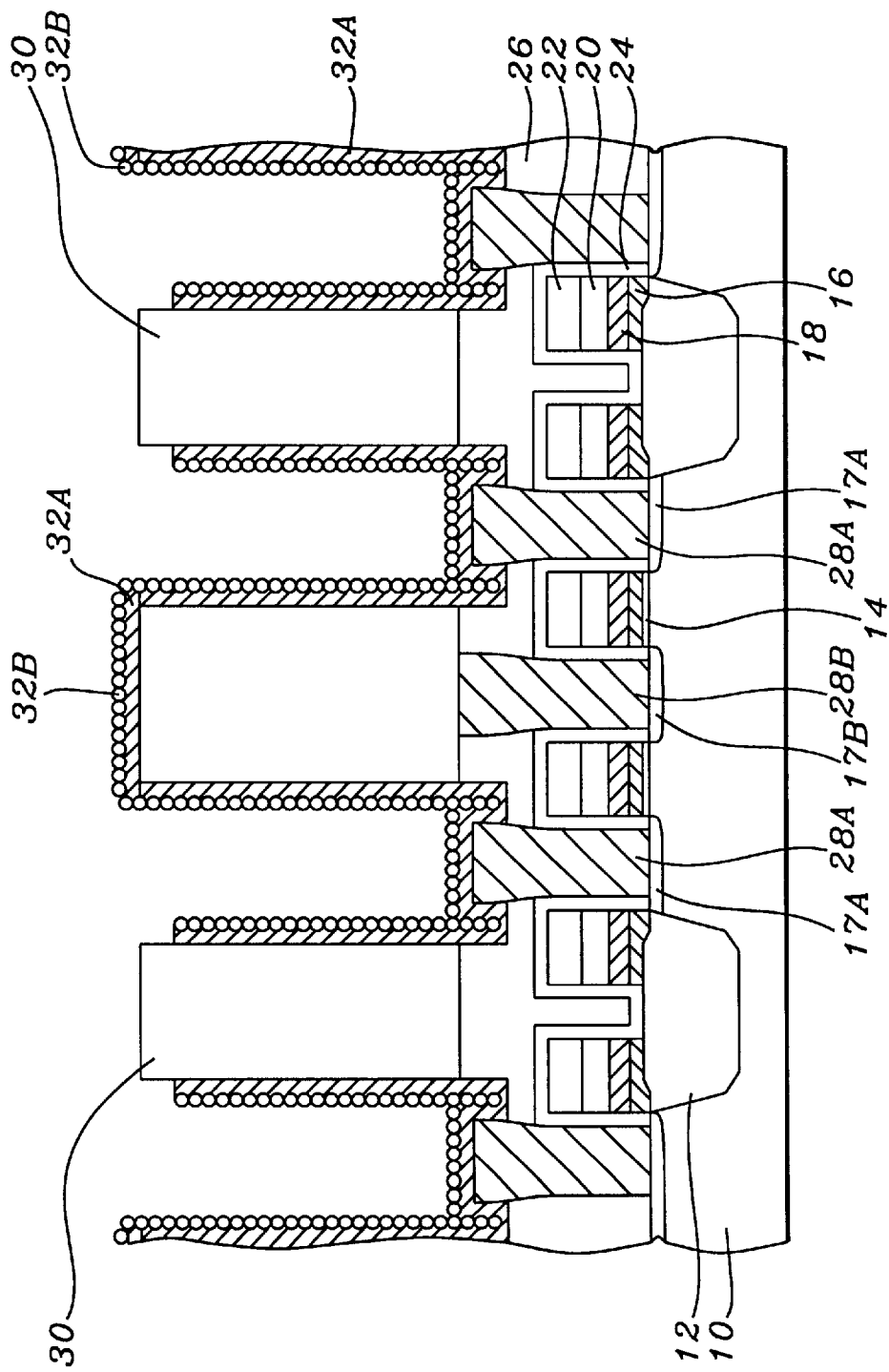

Referring to FIG. 8, the remaining photoresist 34 is completely removed including the photoresist in the first openings 1. For example the photoresist can be removed by plasma ashing in oxygen or ozone.

Figure 9:
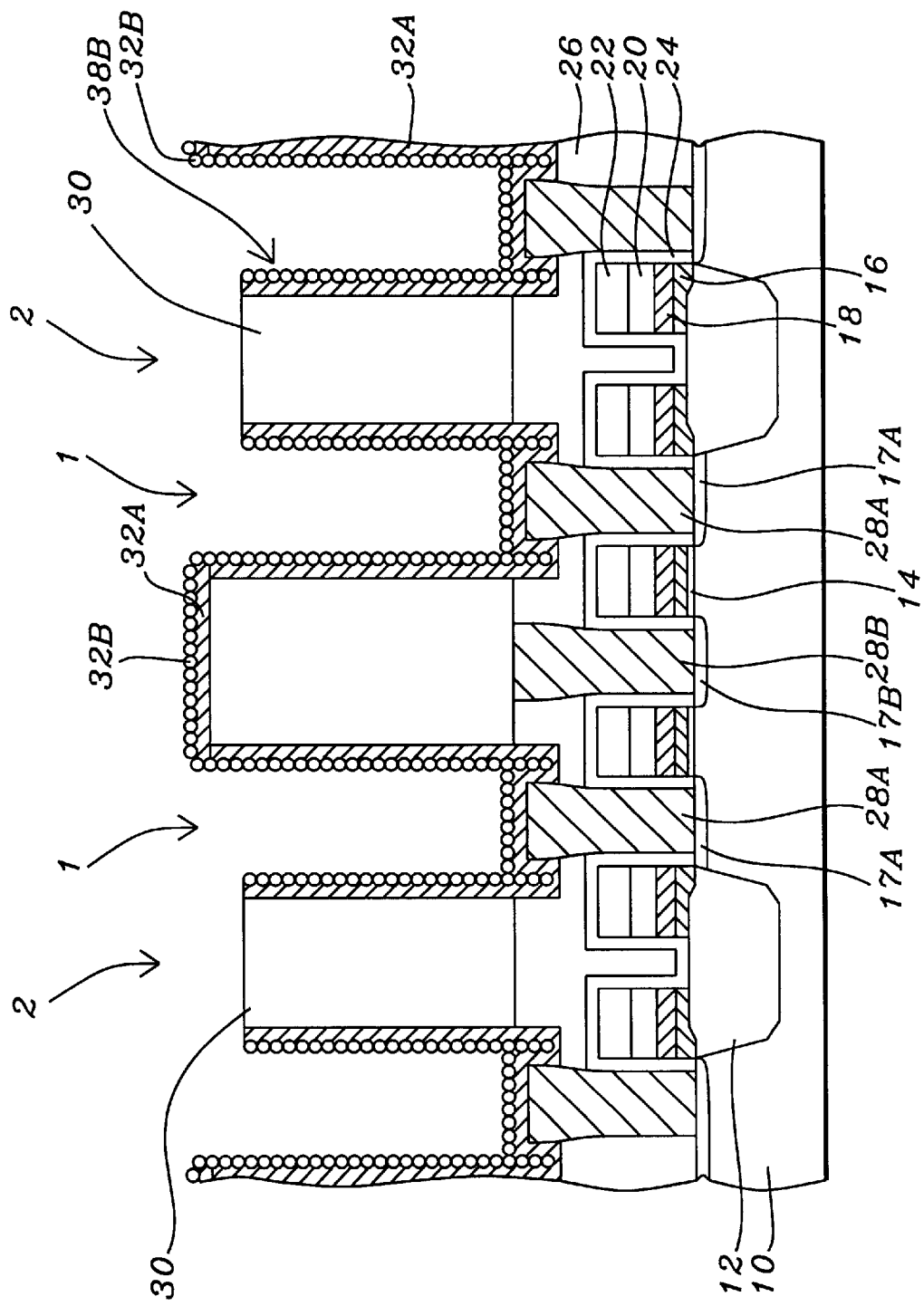

Referring to FIG. 9, the exposed portions of the second insulating layer 30 are then selectively and partially etched back to recess those portions below the top portions of the second insulating layer 30 over the second plug contacts 28B. Preferably layer 30 is recessed sufficiently deep to provide a continuous capacitor top plate at a later process step, but more specifically is recessed to a depth of between about 1000 and 3000 Angstroms. The second insulating layer 30, composed of $SiO_2$, is preferably etched using a wet etch, such as a hydrofluoric acid solution. The first conducting layer (32A, 32B) serves as a hard mask to protect the second insulating layer 30 over the second plug contacts 28B during the etching.

Still referring to FIG. 9, a thin conformal insulating dielectric layer 38 is formed on the surface of the first conducting layer 32B to form the capacitor interelectrode dielectric layer. Layer 38 is not explicitly shown in FIG. 9 to simplify the drawing. Layer 38 is a thin insulating layer having a high dielectric constant, and is essentially pin-hole free. For example, a silicon oxide-silicon nitride-silicon oxide layer (ONO) can be used as is commonly practiced in the semiconductor industry. Also other more exotic materials, such as $Ta_2O_5$, can be used for layer 38. Typically layer 38 is formed to a thickness of less than 100 Angstroms.

Figure 10:
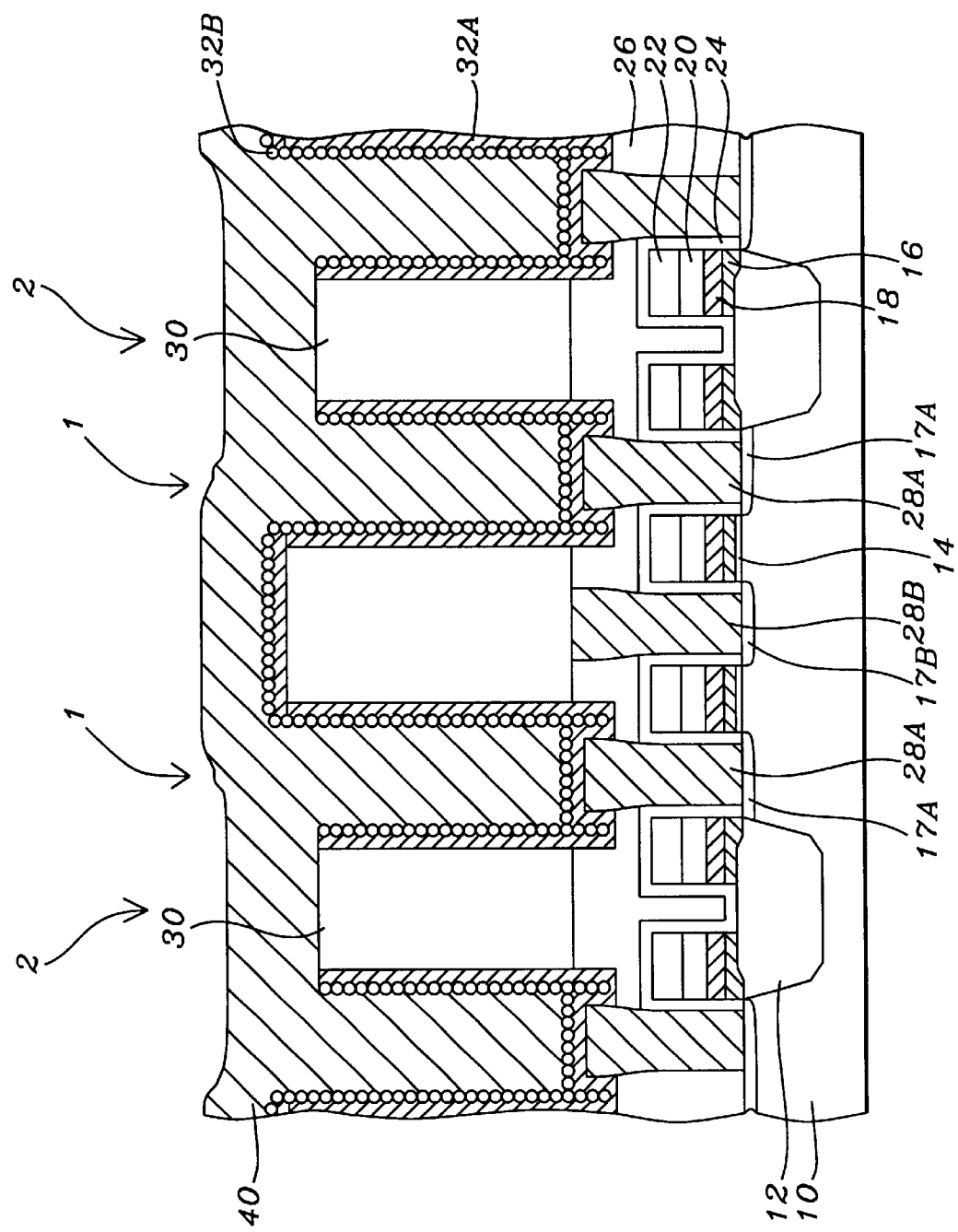

Next, as shown in FIG. 10, a second conducting layer 40 is deposited sufficiently thick to fill the first openings 1 and to fill the recesses 2 over the second insulating layer 30, and more specifically is deposited to a thickness of between about 2000 and 5000 Angstroms. The second conducting layer 40 is preferably a doped polysilicon, and is deposited by LPCVD using $SiH_4$ as the reactant gas, and is in-situ doped by including a dopant gas such as arsine during deposition. Layer 40 is doped to a preferred concentration of between about 1.0 E 19 and 1.0 E 22 atoms/$cm^3$.

Figure 11:
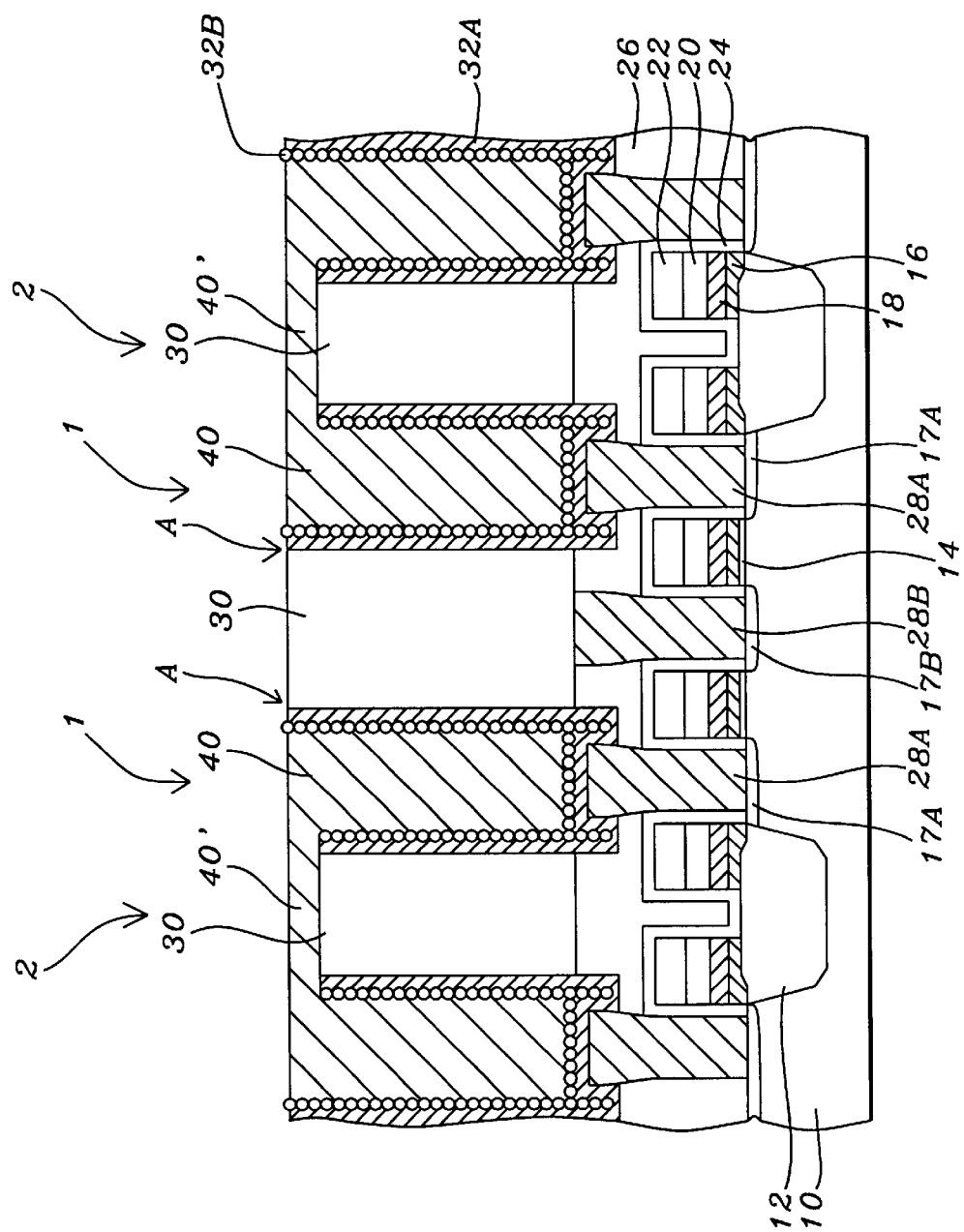
Figure 12:
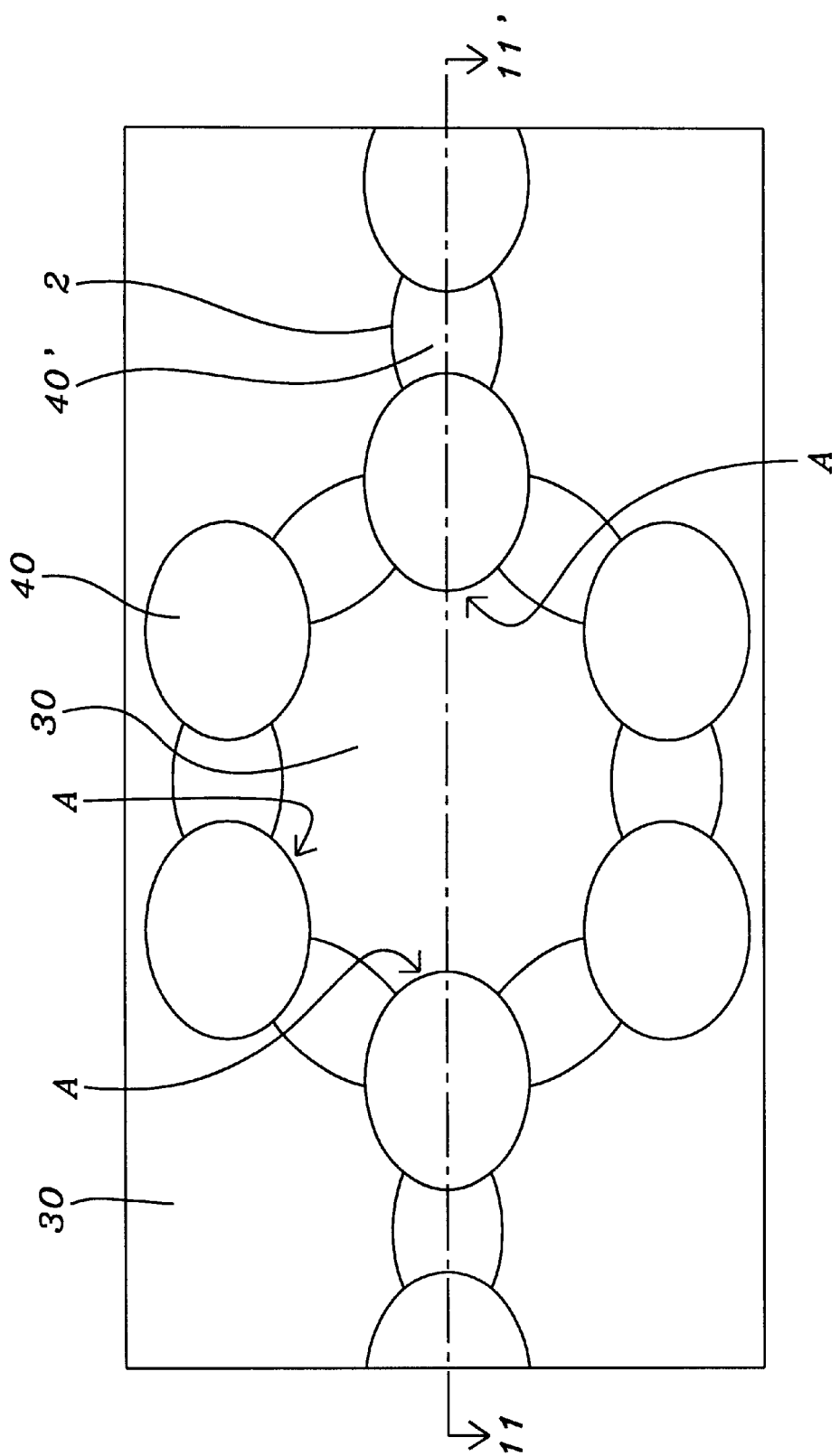

Referring to FIG. 11, a novel feature of the process is now described. The second conducting layer 40 and the first conducting layer (layers 32B and 32A) are chemically-mechanically polished back to the second insulating layer 30. This polishing step completes the capacitor bottom electrodes 32 (32A and 32B) and at the same time patterns the capacitor top plates 40 (top electrodes). By virtue of the polish-back, the capacitor top plates are automatically self-aligned to the edge A of the second insulating layer 30 over the second plug contacts 28B. Further, the remaining second conducting layer 40' over the recesses between the capacitors (openings 2) provides the electrical connections between the individual capacitors. This sequence of process steps and novel structure provide improved overlay margin between the capacitor and the bit-line contacts that are formed next in the second insulating layer 30 to the second plug contacts 28B. A top view of this novel structure is shown in FIG. 12. The portions of the second conducting layer 40' form part of, and electrically interconnect the capacitor top electrodes 40 to form a completed capacitor top plate.

Figure 13:
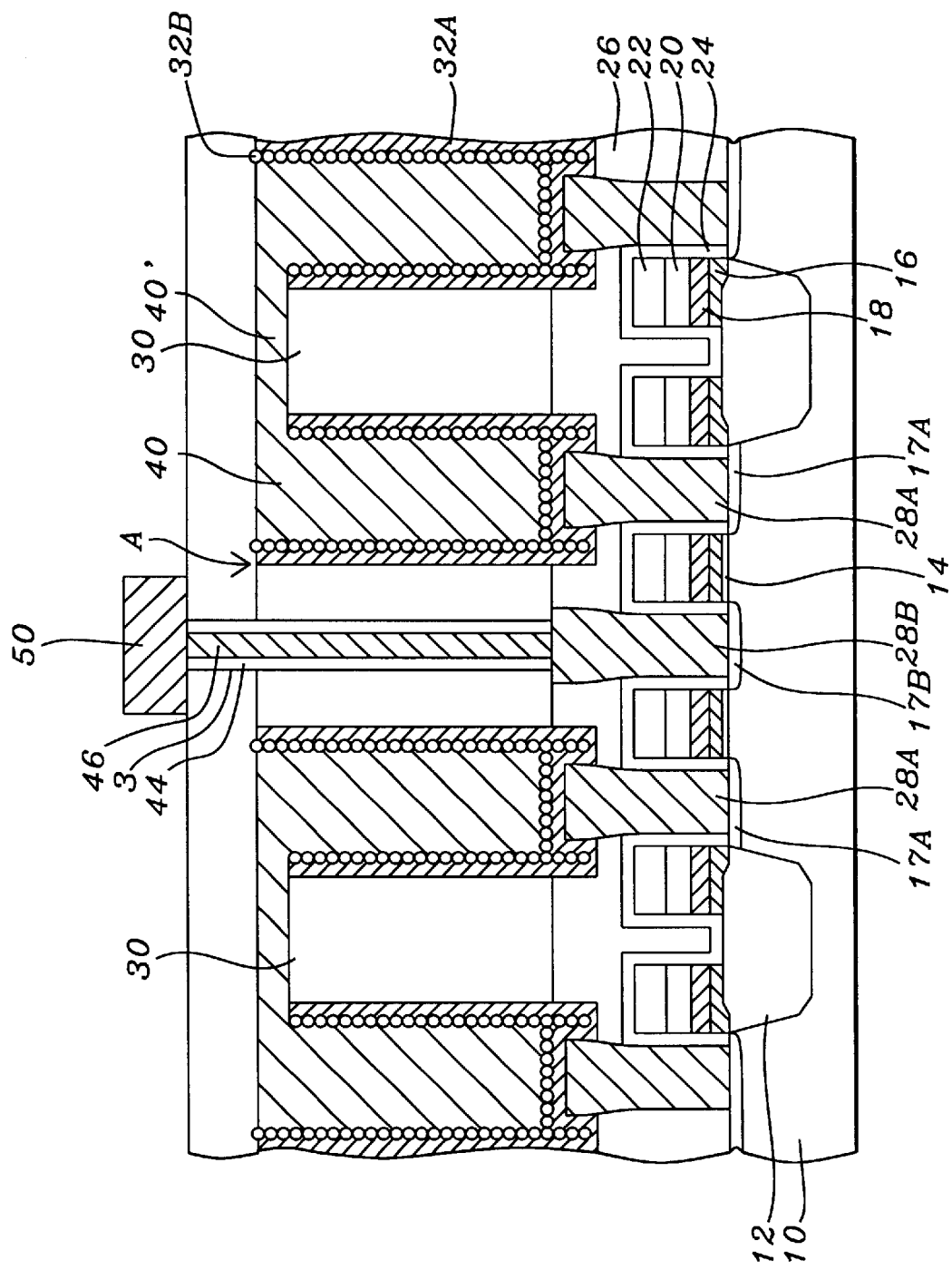

Referring to FIG. 13, a third insulating layer 42 is deposited to electrically insulate the capacitor top plate 40. Layer 42 is preferably $SiO_2$ and is deposited by LPCVD to a thickness of between about 2000 and 5000 Angstroms. Third openings 3 for bit-line contacts are anisotropically plasma etched in the third insulating layer 42 and in the second insulating layer 30 aligned over and etched to the second plug contacts 28B. A thin barrier/adhesion layer 44 is deposited and a third conducting layer 46 is deposited to fill the second openings and is polished or etched back to form bit-line contacts 46. The barrier/adhesion layer 44 is typically titanium/titanium nitride (Ti/TiN). The third conducting layer 46 is preferably tungsten (W) and is deposited by CVD. The third conducting layer 46 is chemically-mechanically polished back to the third insulating layer 42 using commercially available polishing equipment and an appropriate polishing slurry. A fourth conducting layer 50 is deposited. The fourth conducting layer 50 is preferably aluminum-copper alloy deposited by CVD to a thickness of between about 2000 and 5000 Angstroms. The fourth conducting layer 50 is then patterned using a photoresist mask and anisotropic plasma etching to form bit lines 50. The bit lines are formed over and contacting the bit-line contacts 46 to complete the array of novel memory cells for the DRAM device.

Figure 14:
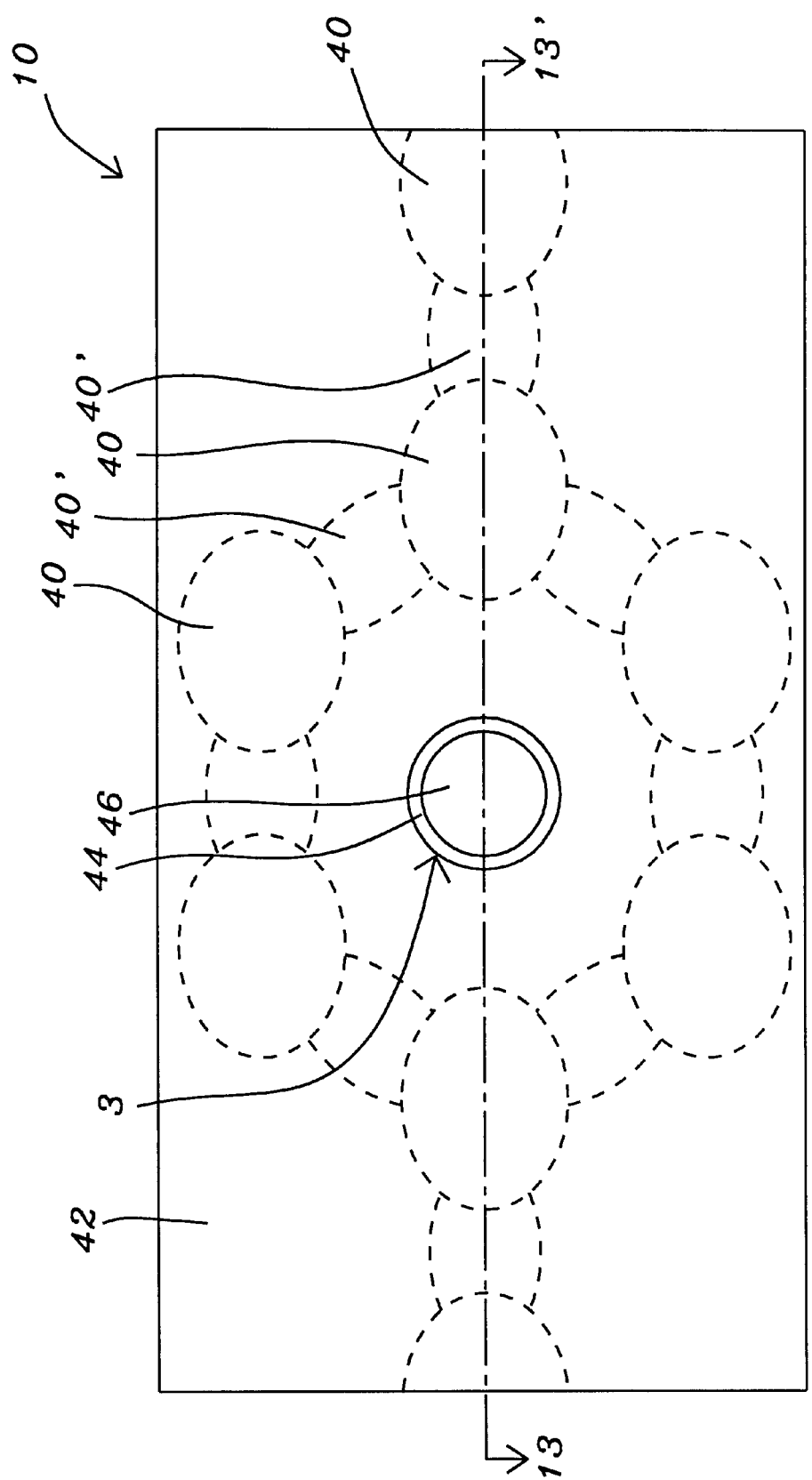

FIG. 14 shows a top view of the structure shown in FIG. 12 and includes the bit line contacts 46 in the third openings 3. The bit lines 50 are not depicted in the top view of FIG. 14 to simplify the drawing.

While the invention has been particularly shown and described with reference to the preferred embodiment thereof, it will be understood by those skilled in the art that various changes in form and details may be made without departing from the spirit and scope of the invention.

What is claimed is:

1. An array of memory cells on a dynamic random access memory (DRAM) device comprised of:

a substrate having partially completed DRAM devices consisting of an array of device areas surrounded and electrically isolated by field oxide regions, each of said device areas having field effect transistors with gate electrodes and first and second source/drain areas;

a first insulating layer having conducting first plug contacts to said first source/drain areas for capacitors, and having conducting second plug contacts to said second source/drain areas for bit-line contacts;

a second insulating layer on said first insulating layer, and said second insulating layer having first openings aligned over and to said first plug contacts;

capacitor bottom electrodes formed from a conformal first conducting layer in said first openings;

said second insulating layer having recessed second openings from top surface of said second insulating layer between said capacitor bottom electrodes while leaving non-recessed portions of said second insulating layer over said second plug contacts;

an interelectrode dielectric layer on said capacitor bottom electrodes;

capacitor top plates composed of a second conducting layer that fills said first openings, said second conducting layer coplanar and self-aligned to said non-recessed portions of said second insulating layer over said second plug contacts;

a third insulating layer over said top plates, and having third openings aligned over said second plug contacts, and said third openings extending through said second insulating layer to said second plug contacts, and said third openings filled with a third conducting layer for bit-line contacts;

a patterned fourth conducting layer over said bit-line contacts for bit lines.

2. The structure of claim 1, wherein said first insulating layer is composed of borophosphosilicate glass and has a thickness of between about 4000 and 6000 Angstroms.

3. The structure of claim 1, wherein said conducting first and second plug contacts are composed of polysilicon and are doped N type to a concentration of between about $3.0\ E\ 19$ and $5.0\ E\ 20$ atoms/cm$^3$.

4. The structure of claim 1, wherein said second insulating layer is composed of borophosphosilicate glass.

5. The structure of claim 1, wherein said first and said second conducting layers are conductively doped polysilicon.

6. The structure of claim 1, wherein said third and said fourth conducting layers are metal.

* * * * *